United States Patent
Gloor et al.

(10) Patent No.: US 10,651,624 B2
(45) Date of Patent: May 12, 2020

(54) OPTOELECTRONIC MODULES HAVING FEATURES FOR IMPROVED ALIGNMENT AND REDUCED TILT

(71) Applicant: AMS SENSORS SINGAPORE PTE. LTD., Singapore (SG)

(72) Inventors: Matthias Gloor, Boswil (CH); Yit Chee Chiang, Singapore (SG)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/069,251

(22) PCT Filed: Dec. 23, 2016

(86) PCT No.: PCT/SG2016/050617
§ 371 (c)(1),
(2) Date: Jul. 11, 2018

(87) PCT Pub. No.: WO2017/123151
PCT Pub. Date: Jul. 20, 2017

(65) Prior Publication Data
US 2019/0036297 A1    Jan. 31, 2019

Related U.S. Application Data

(60) Provisional application No. 62/277,123, filed on Jan. 11, 2016.

(51) Int. Cl.
*H01L 21/66* (2006.01)
*H01S 5/022* (2006.01)
(Continued)

(52) U.S. Cl.
CPC .......... *H01S 5/02268* (2013.01); *G02B 7/021* (2013.01); *G02B 7/023* (2013.01);
(Continued)

(58) Field of Classification Search
CPC ... H01L 27/146; H01L 31/00; H01L 31/0203; H01L 31/02325; H01K 1/08; H01K 1/20;
(Continued)

(56) References Cited

U.S. PATENT DOCUMENTS

2011/0044369 A1* 2/2011 Andry ................. G02B 6/4204
                                                              372/50.124
2011/0267823 A1   11/2011 Angelini et al.
(Continued)

FOREIGN PATENT DOCUMENTS

CN    201477271       5/2010
WO    2010/111465     9/2010

OTHER PUBLICATIONS

ISR/AU, International Search Report for PCT/SG2016/050617 (dated Feb. 10, 2017).

*Primary Examiner* — Brook Kebede
(74) *Attorney, Agent, or Firm* — Michael Best & Friedrich LLP

(57) ABSTRACT

This disclosure describes an optoelectronic to provide ultra-precise and stable packaging for an optoelectronic device such as a light emitter or light detector. The module includes spacers to establish precise separation distances between various parts of the module. One of the spacers serves as a support or mount for an optical element that comprises a mask.

17 Claims, 11 Drawing Sheets

(51) Int. Cl.

| | | |
|---|---|---|
| H01S 5/00 | (2006.01) | |
| H01S 5/42 | (2006.01) | |
| H01L 27/146 | (2006.01) | |
| H01L 27/14 | (2006.01) | |
| H01L 31/0232 | (2014.01) | |
| H01K 1/08 | (2006.01) | |
| G02B 7/02 | (2006.01) | |
| H01L 31/0203 | (2014.01) | |
| H01K 1/20 | (2006.01) | |
| H01L 31/00 | (2006.01) | |
| G02B 5/00 | (2006.01) | |
| H01L 51/52 | (2006.01) | |
| G02B 6/42 | (2006.01) | |
| H01L 23/544 | (2006.01) | |
| H01S 5/024 | (2006.01) | |

(52) U.S. Cl.
CPC ............... *G02B 7/025* (2013.01); *H01K 1/08* (2013.01); *H01K 1/20* (2013.01); *H01L 27/14* (2013.01); *H01L 27/146* (2013.01); *H01L 31/00* (2013.01); *H01L 31/0203* (2013.01); *H01L 31/02325* (2013.01); *H01S 5/005* (2013.01); *H01S 5/0014* (2013.01); *H01S 5/02208* (2013.01); *H01S 5/02276* (2013.01); *H01S 5/02288* (2013.01); *H01S 5/423* (2013.01); *G02B 5/003* (2013.01); *G02B 5/005* (2013.01); *G02B 6/4204* (2013.01); *H01L 22/20* (2013.01); *H01L 23/544* (2013.01); *H01L 27/14618* (2013.01); *H01L 27/14625* (2013.01); *H01L 27/14636* (2013.01); *H01L 51/5237* (2013.01); *H01L 2223/54426* (2013.01); *H01L 2224/48091* (2013.01); *H01L 2224/49111* (2013.01); *H01L 2224/49175* (2013.01); *H01S 5/02476* (2013.01)

(58) Field of Classification Search
CPC .... H01S 5/0014; H01S 5/005; H01S 5/02208; H01S 5/02268; H01S 5/02276; H01S 5/02288; H01S 5/423; G02B 6/00; G02B 6/42; G02B 7/021; G02B 7/023; G02B 7/025
USPC ........................................ 438/15; 257/97–101
See application file for complete search history.

(56) References Cited

U.S. PATENT DOCUMENTS

| | | |
|---|---|---|
| 2011/0304930 A1 | 12/2011 | Welch et al. |
| 2014/0167196 A1 | 6/2014 | Heimgartner et al. |
| 2016/0306265 A1* | 10/2016 | Riel .................. G02B 7/02 |

* cited by examiner

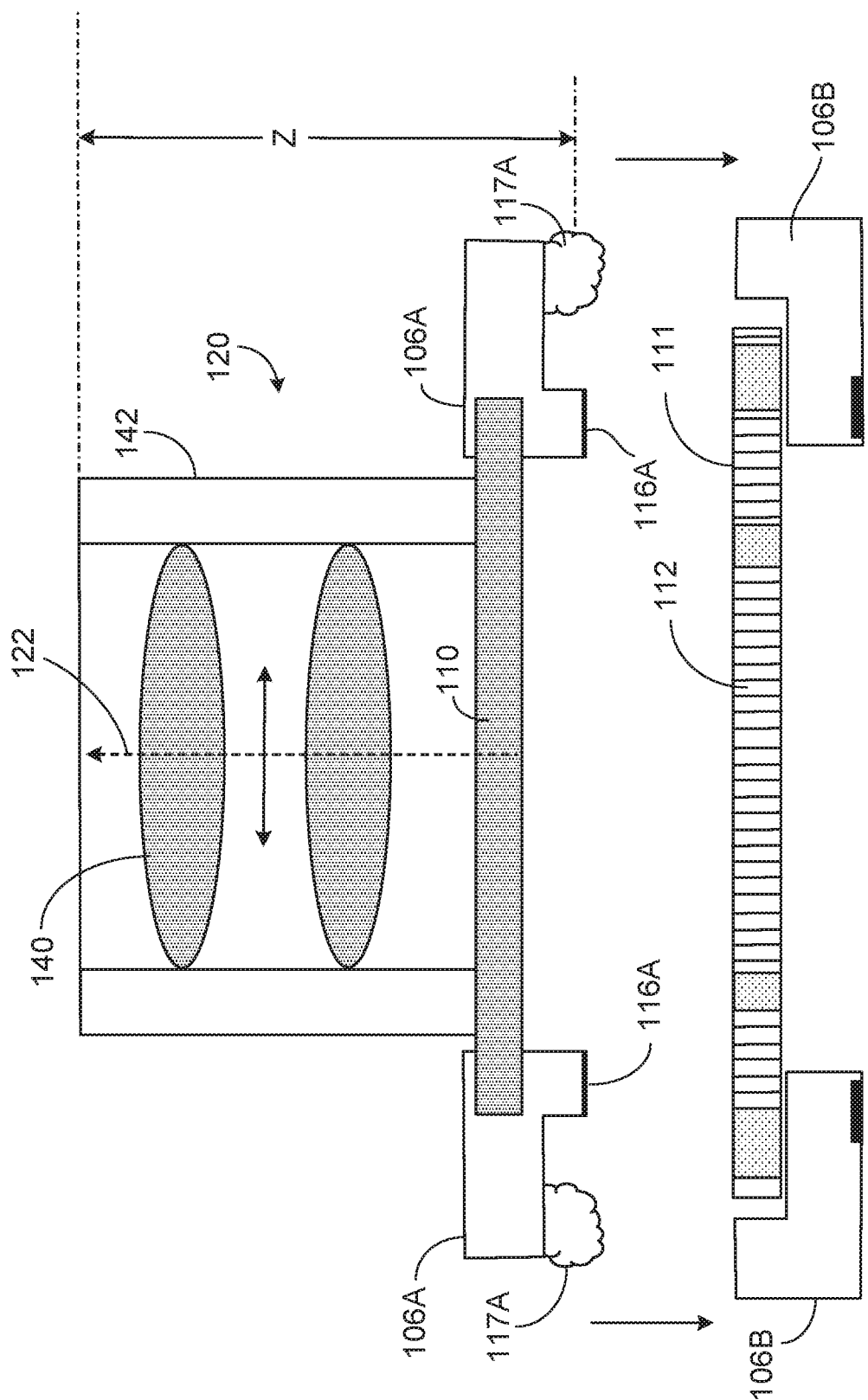

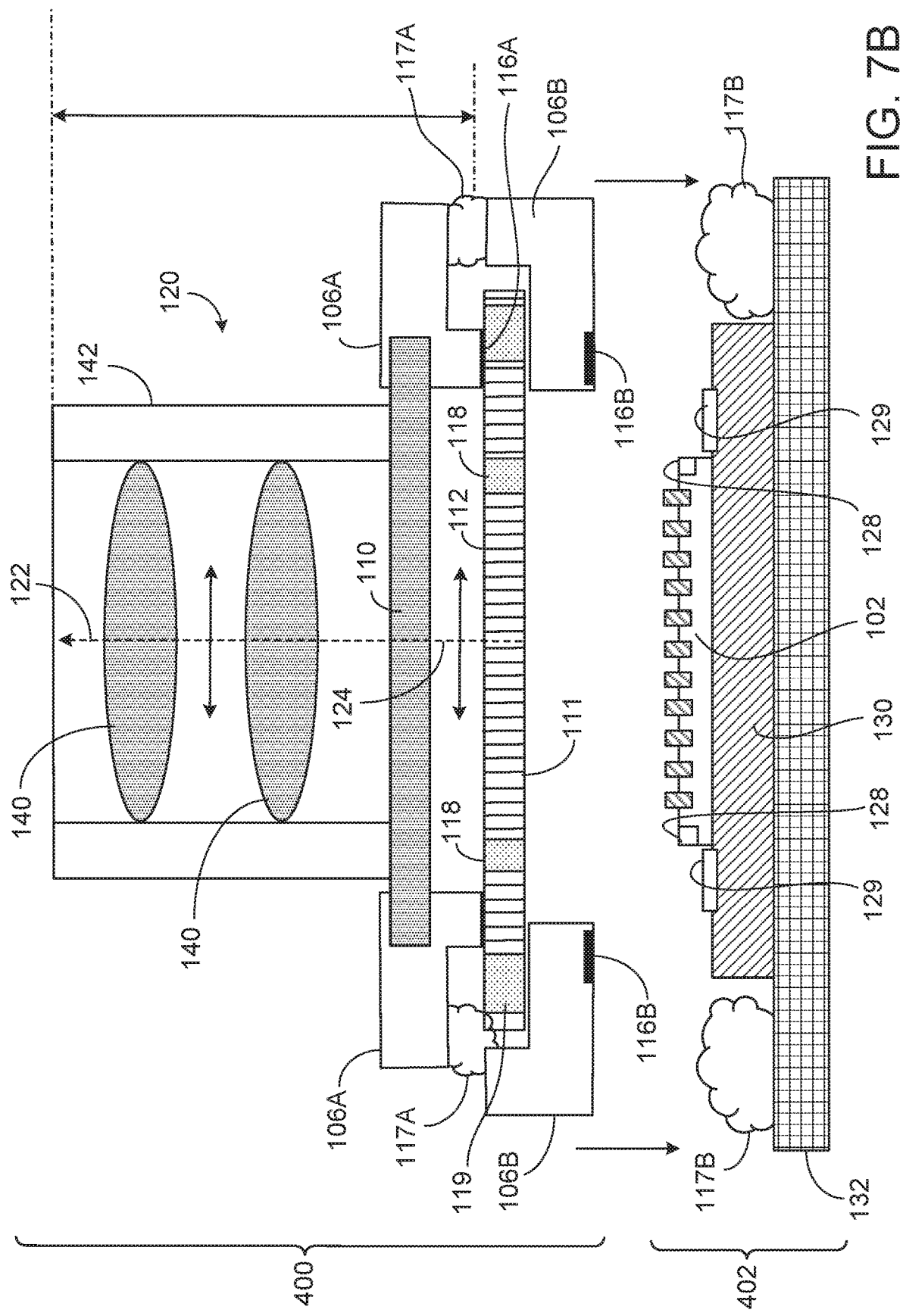

– 1 –

OPTOELECTRONIC MODULES HAVING FEATURES FOR IMPROVED ALIGNMENT AND REDUCED TILT

TECHNICAL FIELD

The present disclosure relates to compact optoelectronic modules.

BACKGROUND

Various consumer electronic products and other devices include a packaged light emitter module designed for precision light projection and/or generation applications. The spatial dimensions of such modules generally need to be controlled to high precision, such that the optical elements and the light emitting element are precisely positioned, for example, at an optimal distance. Thus, the modules should have very small spatial (dimensional) and optical (e.g., focal length) tolerances for optimal performance. However, the use, for example, of adhesive in the packaged light emitter module, as well as other factors such as the inherent manufacturing tolerances of the support structure, often expand the tolerances of the module to an unacceptable level. The foregoing issues may be applicable to light detector modules as well.

SUMMARY

This disclosure describes various modules that, in some cases, can provide ultra-precise and stable packaging for an optoelectronic device such as a light emitter or light detector. Among other things, the disclosure describes modules that includes spacers to establish precise separation distances between various parts of a module. One of the spacers serves as a support or mount for an optical element that comprises a mask.

For example, in one aspect, an optoelectronic module includes an electrically conductive trace, and an optoelectronic device that is mounted on the trace and is operable to emit or detect light. The module further includes an optical element having a mask disposed over the optoelectronic device, and an optical sub-assembly disposed over the optical element. The mask can comprise, for example, a black chrome pattern on a transparent substrate. A first spacer, which establishes a distance between the optical element and the optical sub-assembly, is in direct contact with an upper surface of the optical element. A second spacer, which establishes a distance between the trace and the optical element, supports the optical element and is in direct contact with an upper surface of the trace. The first and second spacers are attached to one another by adhesive. The optical element is disposed within a recess in the second spacer and is supported by direct contact with surfaces of the second spacer.

Various implementations include one or more of the following features. For example, the module can have flat surfaces at corners of the recess in which the optical element is disposed. An underside of the optical element can be in direct contact with the flat surfaces which support the optical element. There also can be recessed pockets that are adjacent the flat surfaces and contain adhesive in contact with the underside of the optical element. In some instances, portions of the recessed pockets are not filled with adhesive and provide venting channels to allow gas in a chamber over the optoelectronic device to escape.

In some cases, a cutout region extends through the second wafer, at least part of the cutout region being located directly above an alignment mark on an upper surface of the trace or on an upper surface of the optoelectronic device. Likewise, in some instances, there is a cutout region extending through the second wafer, at least part of the cutout region being located directly below an alignment mark on the optical element.

The module may also include a flex cable. In some implementations, a portion of the second spacer is undercut to receive the flex cable, which is connected electrically to the electrically conductive trace. The module can include a substrate on which the electrically conductive trace is mounted. Further, in some implementations, the electrically conductive trace defines channels that separate different parts of the trace electrically from one another. The channels can contain adhesive that fixes the second spacer to the substrate. Portions of the channels defined by the electrically conductive trace may extend under the flex cable. In some instances, these portions of the channels are not filled with adhesive and can facilitate venting to transfer heat away from the optoelectronic device.

The disclosure also describes methods of manufacturing the optoelectronic modules.

Various advantages are present in some implementations. For example, ultra-precise and stable packaging can be provided for the optoelectronic device housed in the module. Further, the modules can have very small spatial (dimensional) and optical (e.g., focal length) tolerances to achieve optimal performance. Tilt of the mask with respect to the optoelectronic device can be reduced or eliminated.

Other aspects, features and advantages will be apparent from the following detailed description, the accompanying drawings, and the claims.

BRIEF DESCRIPTION OF THE DRAWINGS

FIGS. 7A and 7B illustrate various stages in the assembly process of FIG. 6.

DETAILED DESCRIPTION

Figure 1:
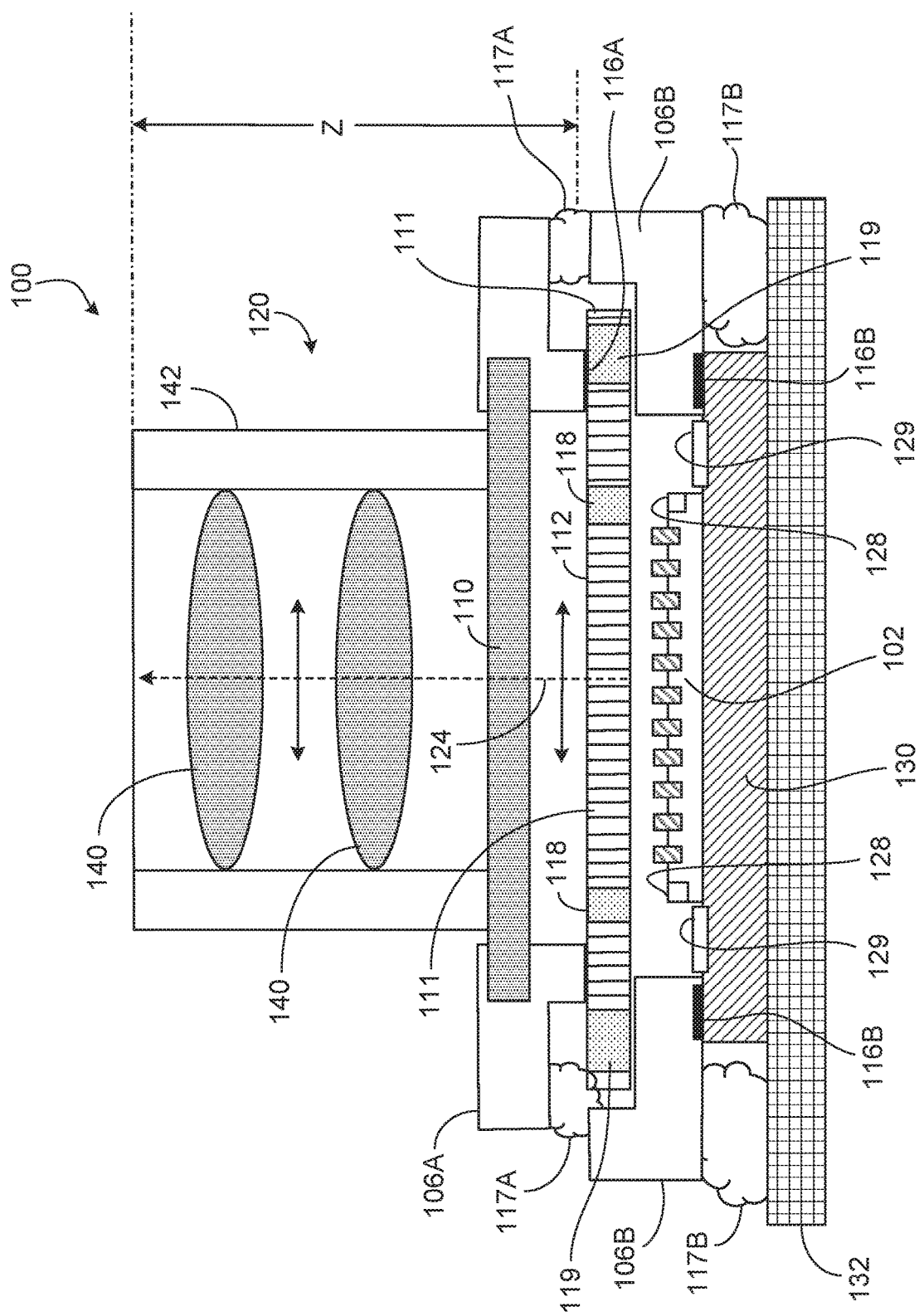
FIG. 1 is a cross-sectional view of an example of an optoelectronic module.
Figure 2:
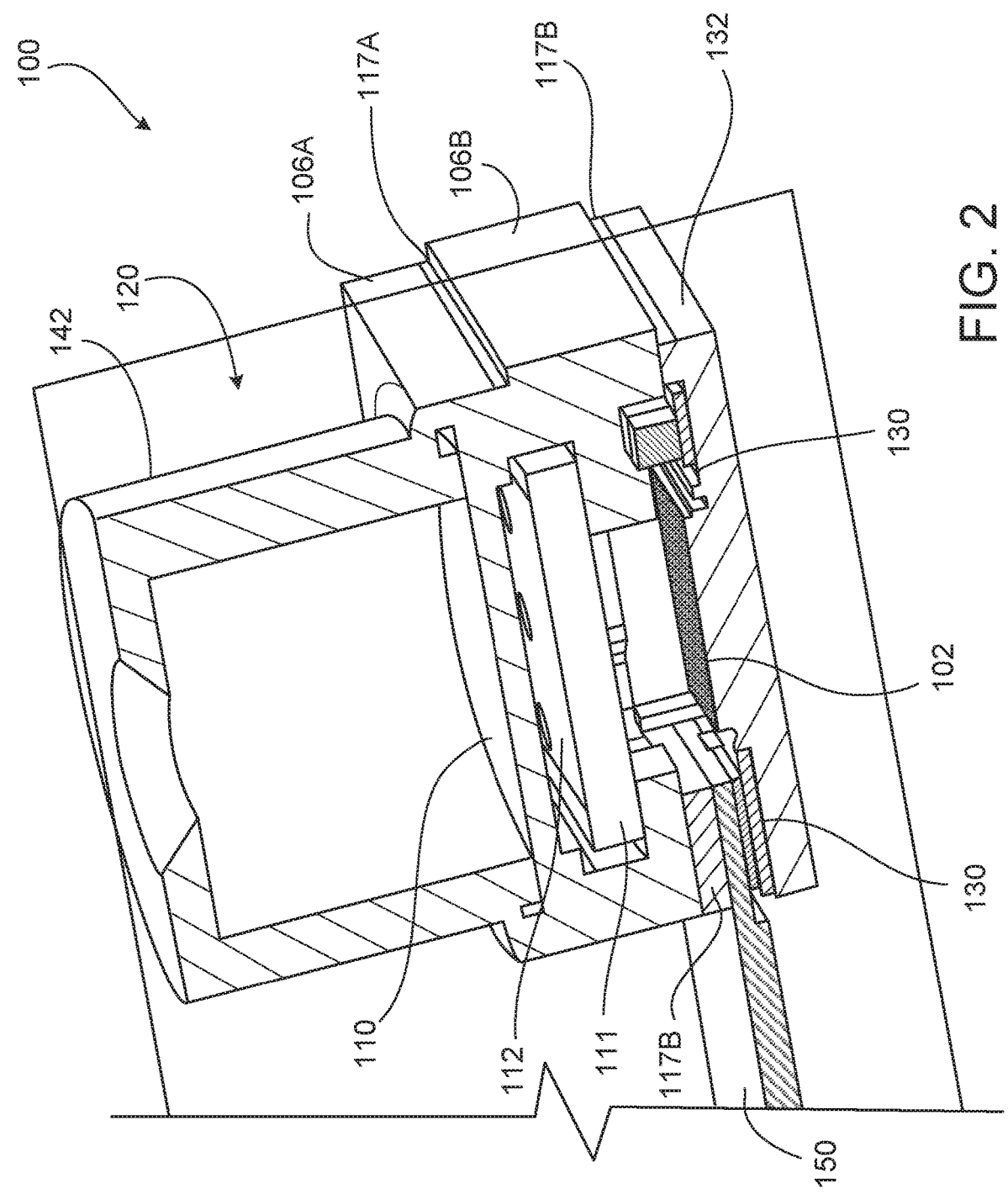
FIG. 2 illustrates a partial cut-away view of the optoelectronic module.

As shown in FIGS. 1 and 2, an optoelectronic module 100 is operable to generate a high-quality light projection/illumination. The module 100 includes a light emitting element 102 mounted on a sub-mount assembly, which can include, for example, a metal trace 130 on an electrically insulating substrate 132. The substrate 132 can be composed, for example, of a ceramic material such as aluminum nitride. The aluminum nitride substrate 132, which has a thermal conductivity of about 70-180 W/(mK), can help conduct heat away from the emitter 102

To facilitate horizontal alignment of the light emitting element 102 on the metal trace 130, visual alignment features 129 can be provided on the upper surface of the metal trace 130. The light emitting element 102 can be, for example, of the type that generates coherent, directional, spectrally defined light emission (e.g., a vertical cavity surface emitting laser (VCSEL) or a laser diode). In some implementations, the light emitter 102 is operable to emit infra-red (IR) light. As the operational temperature of the light emitter 102 may be relatively high, the metal trace 130 can be composed of a material such as a copper alloy exhibiting low thermal expansion. Such materials have relatively high thermal conductivity and, therefore, also can help provide good thermal management for the module. For example, a metal trace 130 comprised primarily of copper (whose thermal conductivity is about 260 W/(mK)) also can facilitate heat being conducted away from the module rapidly, thereby preventing dimensional changes due to thermal expansion.

The module 100 includes an optical element 111 comprising a mask 112 (e.g., a black chrome pattern) on a transparent substrate disposed over the light emitting element 102. An optical sub-assembly 120 is disposed over the optical element 111 such that the optical sub-assembly 120, the optical element 111 that includes the mask 112, and the light emitting element 102 are stacked one over the other. The optical sub-assembly 120 can include, for example, a stack of lenses 140 held within a lens barrel 142 that is supported by a transparent substrate 110. To facilitate understanding, the lenses 140 are not shown in FIG. 2. Light emitted by the light emitting element 102 passes through the mask 112 and then through the optical sub-assembly 120, before exiting the module 100.

To generate a high-quality light projection/illumination, precise alignment preferably should be provided as follows: (1) the focal length of the optical sub-assembly 120 should fall on the plane of the mask 112, and (2) the (central) optical axis 122 of the sub-assembly 120 should coincide with the (central) optical axis 124 of the light emitting element 102. In general, it is difficult to control precisely the thickness of adhesive layers, which sometimes are used to fix components of a module to one another. Accordingly, in the module 100 of FIGS. 1 and 2, a first spacer 106A establishes a precise separation distance between the optical assembly 142 and the optical element 111 that includes the mask 112. A second spacer 106B serves as a support or mount for the optical element 111 and establishes a precise separation distance between the mask 112 on the optical element 111 and the light emitting element 102.

As further shown in FIGS. 1 and 2, the first spacer 106A, which laterally surrounds the transparent substrate 110, has vertical alignment surfaces 116A that allow a vertical distance (Z) between the mask 112 and the optical sub-assembly 120 to be defined precisely via a direct mechanical connection. In particular, the vertical alignment surfaces 116A are in direct contact with the upper surface of the optical element 111. The first spacer 106A can be formed separately from the lens barrel 142 of the optical sub-assembly 120, as in the example of FIGS. 1 and 2, or can be formed as a single integral piece with the lens barrel 142.

The second spacer 106B, which laterally surrounds the light emitting element 102 and provides a housing, also includes vertical alignment surfaces 116B that allow a vertical distance between the mask 112 and the light emitting element 102 to be defined precisely via a direct mechanical connection. In particular, the vertical alignment surfaces 116B are in direct contact with the upper surface of the metal trace 130. Direct mechanical contact between the second spacer 106B and the metal trace 130 can result in better height accuracy as there is no intervening layer of variable height/thickness. The second spacer 106B also can be fixed to the substrate 132 by adhesive 117B. Advantageously, in the illustrated example, the adhesive 117B is not in close proximity to the light emitting element 102.

The second spacer 106B, which supports the optical element 111 that includes the mask 112, can be attached to the first spacer 106A via adhesive (e.g., epoxy) 117A. Before attaching the spacers 106A, 106B to one another, the proper position of the (central) optical axis 124 of the light emitting element 102 can be determined, for example, using alignment windows 118 in the optical element 111 and alignment marks 128 on the surface of the light emitting element 102.

Figure 3A:
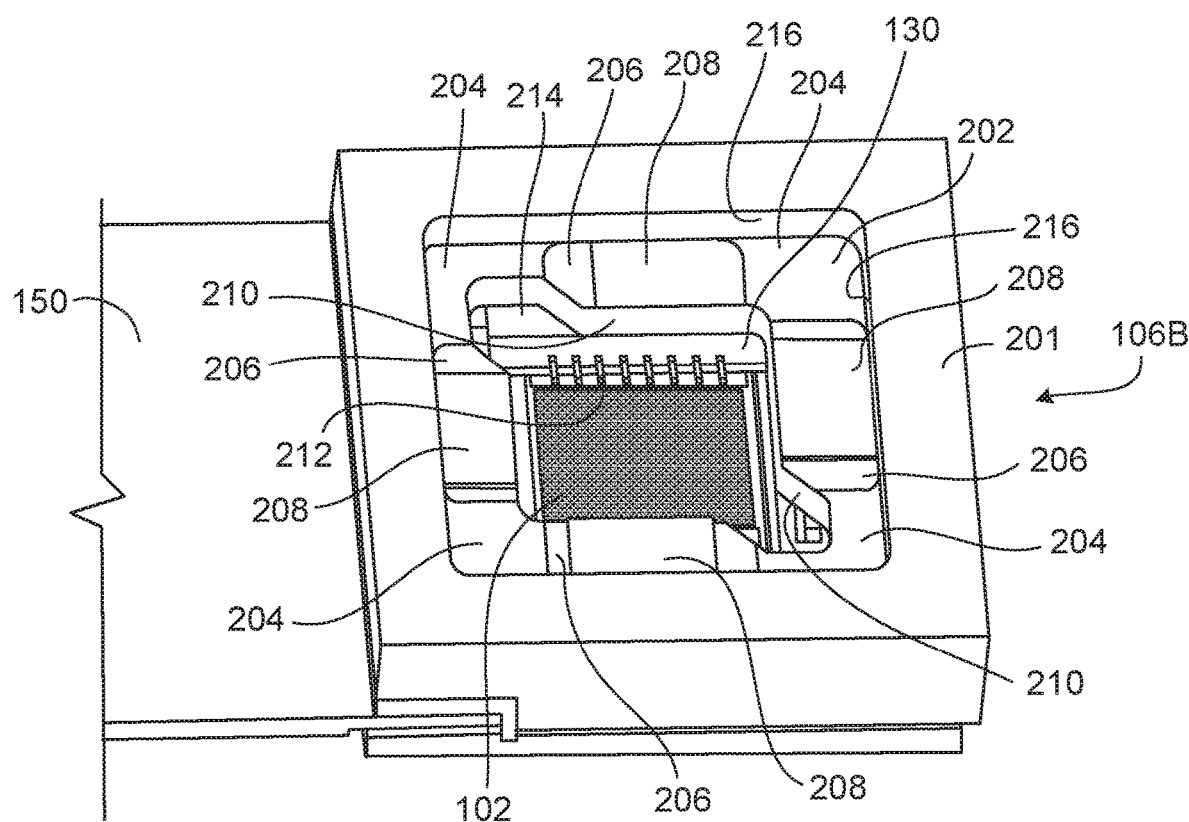
FIGS. 3A and 3B illustrate perspective views of a spacer that serves as a support for an optical element that includes a mask.
Figure 3B:
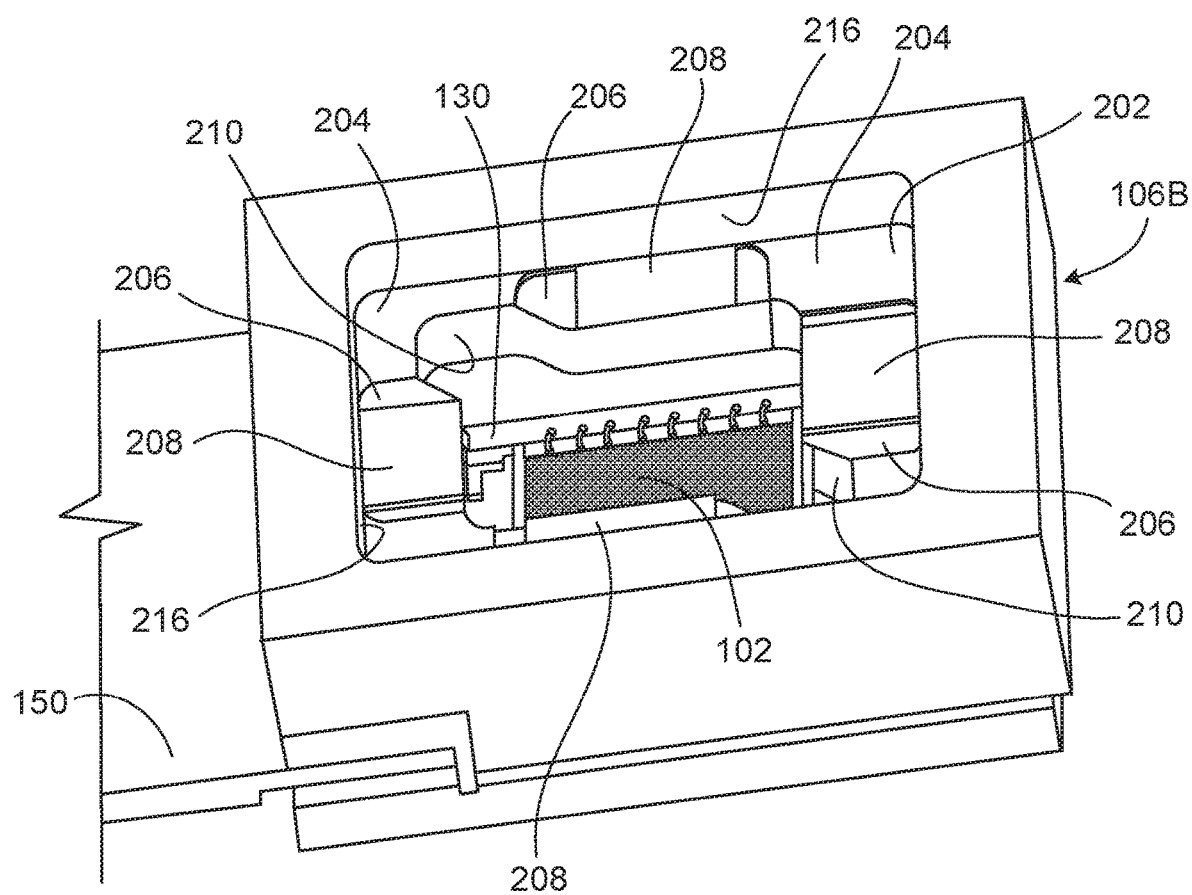

FIGS. 3A and 3B illustrate further details of the second spacer 106B that serves as a support or mount for the optical element 111, which includes the mask 112. One side 201 of the spacer 106B includes a large recess 202 in which the optical element 111 can be disposed. At the corners of the recess 202 are flat regions 204 on which the optical element 111 sits when it is placed within the recess. The upper surfaces of the flat regions 204 are in the same plane, which is substantially parallel to the plane of the metal trace 130. Allowing the optical element 111 to sit directly on the flat regions 204 (i.e., without any intervening adhesive) provides a flat foundation to support the optical element 111 and can help reduce or eliminate tilt that otherwise might occur. Adjacent the flat regions 204, along the sides of the recess 202, are recessed pockets 206 in which adhesive 208 can be provided. The underside of the optical element 111 contacts the adhesive 208 such that when the adhesive is cured, it fixes the optical element 111 in place. By placing the adhesive 208 within the recessed pockets 206, the optical element 111 still rests directly on the flat regions 204. An inner cutout, bounded by inner surfaces 210 of the spacer 106B, is provided in the spacer's center region so that, when the optical element 111 sits within the recess 202, it is positioned directly over the light emitting element 102, which is visible through the cutout in the second spacer 106B in FIG. 3A.

FIGS. 3A and 3B also show wire bonds 212 serving as electrical connections between the light emitting device 102 and the metal trace 130. Regions 214 of the cutout (e.g.; near the corners of the cutout) that extend, for example, beyond the edge of the light emitting element 102, can serve as alignment holes to facilitate locating alignment marks on the upper surface of the trace 130 or the light emitting element 102. The regions 214 also permit visual inspection through the underside of the spacer 106B (e.g., to view alignment marks 119 on the optical element 111 that includes the mask 112).

Several features can be provided to improve ventilation in the module 100. For example, preferably the recessed pockets 206 are not completely filled with adhesive 208. The portions of the pockets 206 not filled with adhesive 208 can provide tunnels that serve as venting channels to allow gas in the chamber above the light emitting element 102 to escape. Likewise, there should be a small amount of space between the peripheral edges of the optical element 111 and the inner side surfaces 216 of the spacer 106B for the same reason. These features can be advantageous, for example, when the air in the chamber above the light emitting element 102 heats up during operation of the light emitting element.

Figure 4A:
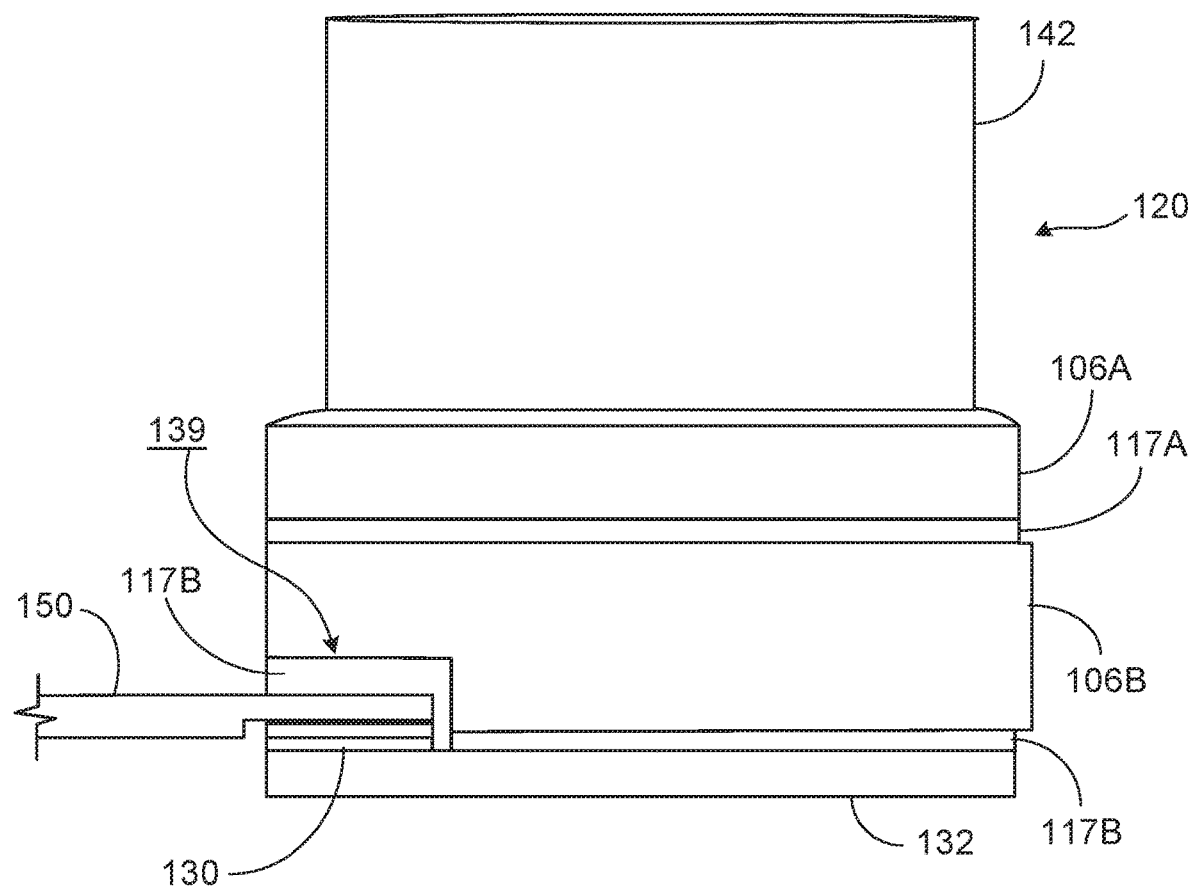
FIG. 4A is a side view of the optoelectronic module.
Figure 4B:
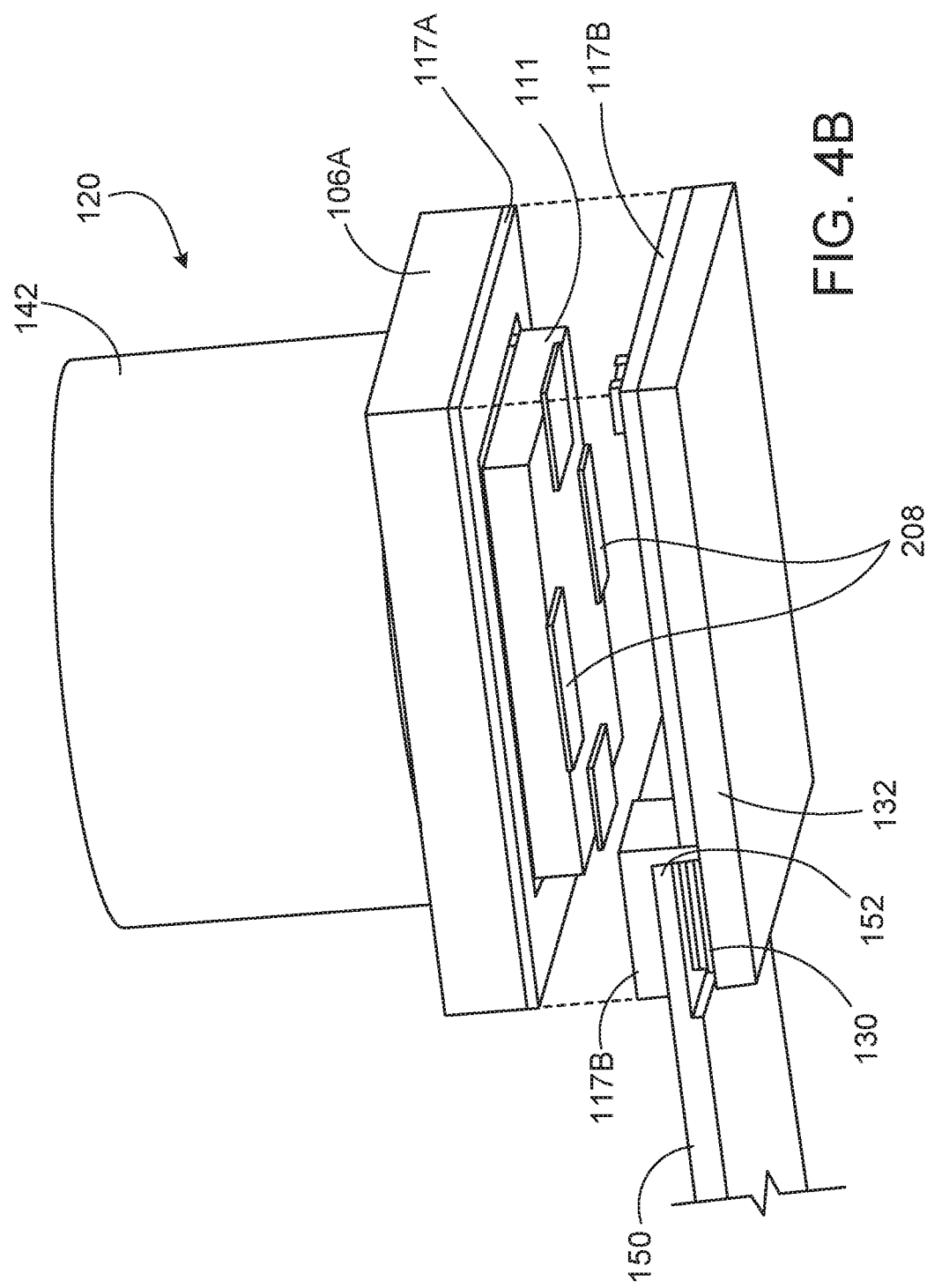
FIG. 4B is a partial cut-away side view of the optoelectronic module.

As illustrated in FIG. 4A, a portion 139 of the second spacer 117B can be undercut so as permit a flex cable 150 to be connected electrically (e.g., using solder) to the metal trace 130. Connecting the flex cable 150 to the module 100 in this manner can help reduce the overall footprint of the module 100. FIG. 4B illustrates a similar view of the module 100 as in FIG. 4A, but with the second spacer 106B removed so that other details of the module can be seen. The adhesive 117B, to which the second spacer 106B is attached, is disposed on the top of the flex cable 150 and also can be present on the side edge 152 of the flex cable 150.

Figure 5A:
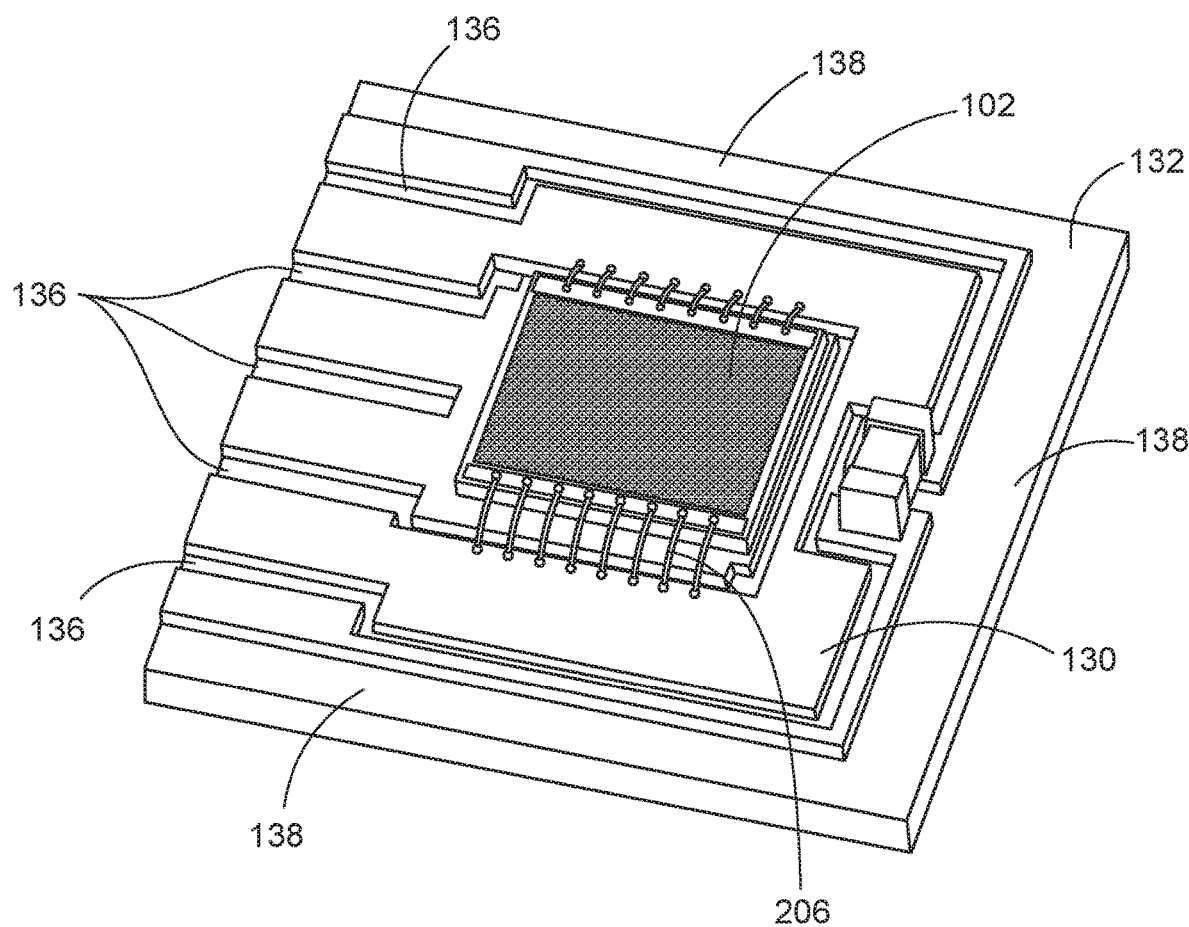
FIG. 5A illustrates further details of an optoelectronic chip mounted on an electrically conductive trace.
Figure 5B:
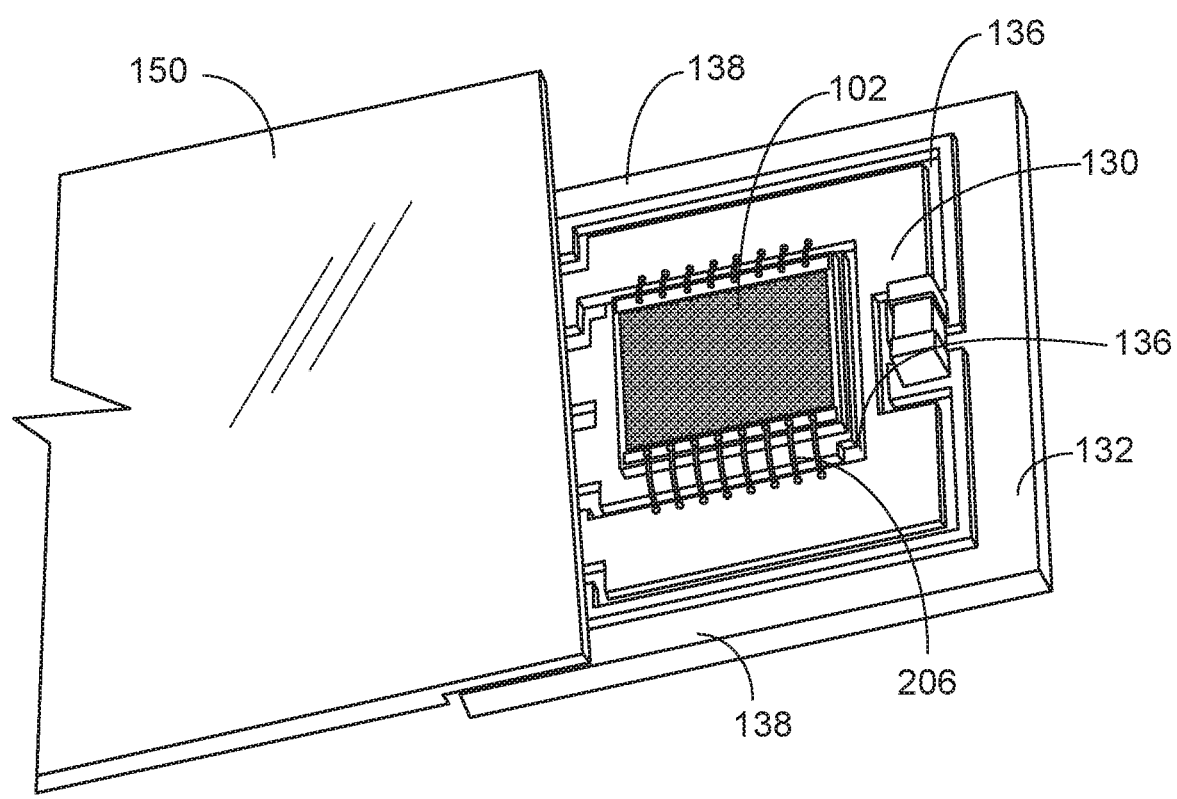
FIG. 5B illustrates a flex cable attached to the metal trace.

As illustrated in FIG. 5A, the metal trace 130 on which the light emitting element 102 is mounted can define channels 136 that separate different parts of the trace 130 electrically from one another. The flex cable 150 then can be soldered to the metal trace 130 as shown in FIG. 5B. When soldered in place, the flex cable 150 partially covers portions of the channels 136. Adhesive then can be dispensed on the surface of the substrate 132 along its periphery 138, within the channels 136, and along the portion of the flex cable 150 directly over the channels 136. The adhesive (shown as 117B in FIGS. 4A and 4B) is used to fix the second spacer 106B in place. Preferably, the adhesive is not present in regions of the channels 136 directly under the flex cable 150. Since those regions of the channels 136 remain unfilled with adhesive, they can serve as venting channels to improve heat flow away from the light emitting element 102.

Figure 6:
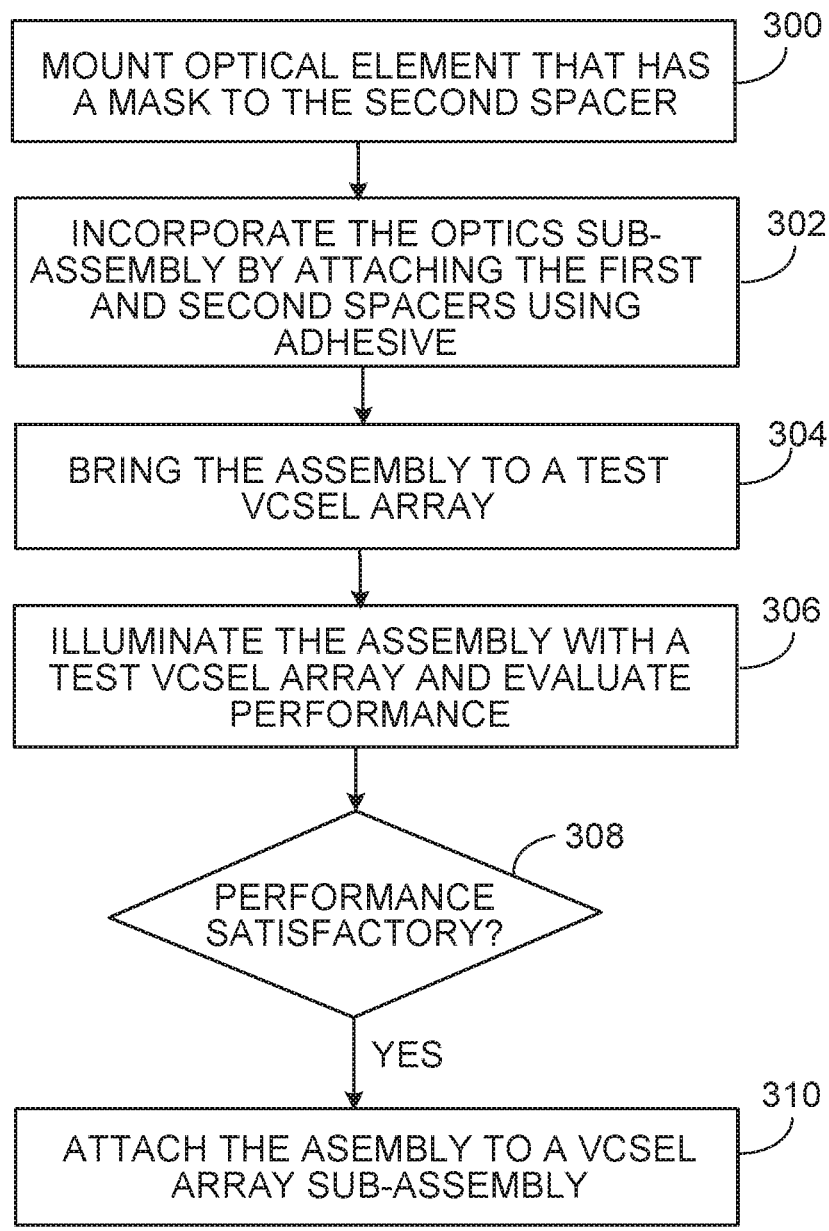
FIG. 6 is a flow chart showing an example of an assembly process for making the optoelectronic module.

FIG. 6 illustrates an assembly process for the module 100. As indicated by 300, the optical element 111 that includes the mask 112 is mounted on the second spacer 106B (see lower section of FIG. 7A). Then, as indicated by 302, the optical sub-assembly 120 is incorporated by attaching the first spacer 106A to the second spacer 106B using adhesive 117A, which then can be cured (see FIG. 7A). During this part of the process, the alignment surfaces 116A of the first spacer 106A are brought into direct contact with the upper surface of the optical element 111. This part of the process results in an assembly 400 (FIG. 7B) that includes the optical assembly 120, the first spacer 106A, the optical element 111 and the second spacer 106B.

Next, as indicated by 304, the assembly 400 is brought to a testing station where its performance can be tested using a test VCSEL array or other active optoelectronic device. For example, the assembly 400 can be illuminated by emitting light (e.g., infra-red radiation) from the test VCSEL array through the optical element 111 and the optical sub-assembly 120, and the optical performance of the assembly 400 can be evaluated (306). If the performance of the assembly 400 is deemed to be satisfactory (308), then, as indicated by 310, the assembly 400 is attached to a optoelectronic device sub-assembly such as a VCSEL array sub-assembly 402 (FIG. 7B). During this part of the process, the second spacer 106B is attached to the substrate 132 by adhesive 117B, and the alignment surfaces 116B of the second spacer 106B are brought into direct contact with the upper surface of the metal trace 130. In some instances, the entire process is automated.

Although the foregoing examples are described in the context of modules that include a light emitter, in some implementations the module may include a different type of active optoelectronic device such as a light detector. For example, instead of the optoelectronic device 102 being a light emitter, the optoelectronic device may be an image sensor that includes an array of light sensitive elements (i.e., pixels) operable to detect light. In the context of modules that include a light detector, the various features described above can be advantageous, for example, in establishing a proper z-height such that the focal-length of a lens is on the image sensor. In the present disclosure, light refers to electromagnetic radiation in any of various parts of the spectrum (e.g., infra-red radiation or light in the visible part of the spectrum)

The modules described here may be integrated into a wide range of consumer products and/or other electronic devices, such as bio devices, mobile robots, surveillance cameras, camcorders, laptop computers, tablet computers, and desktop computers, among others.

Various modifications can be made within the spirit of the disclosure. Also, features that may be described above in connection with different implementations can be combined in the same implementation in some cases. Accordingly, other implementations are within the scope of the claims.

What is claimed is:

1. An optoelectronic module comprising:
    an electrically conductive trace;
    an optoelectronic device mounted on the electrically conductive trace and being operable to emit or detect light;
    an optical element having a mask disposed over the optoelectronic device;
    an optical sub-assembly disposed over the optical element;
    a first spacer in direct contact with an upper surface of the optical element, the first spacer establishing a distance between the optical element and the optical sub-assembly;
    a second spacer that supports the optical element, the second spacer being in direct contact with an upper surface of the trace and establishing a distance between the trace and the optical element;
        wherein the first and second spacers are attached to one another by adhesive, and
        the optical element is disposed within a recess in the second spacer and is supported by direct contact with surfaces of the second spacer.

2. The optoelectronic module of claim 1 having flat surfaces at corners of the recess in which the optical element is disposed, an underside of the optical element being in direct contact with the flat surfaces which support the optical element.

3. The optoelectronic module of claim 2 including recessed pockets containing adhesive in contact with the underside of the optical element, the recessed pockets being adjacent the flat surfaces.

4. The optoelectronic module of claim 3 wherein portions of the recessed pockets are not filled with adhesive and provide venting channels to allow gas in a chamber over the optoelectronic device to escape.

5. The optoelectronic module of claim 1 comprising a second wafer having a cutout region extending there through, at least part of the cutout region being located directly above an alignment mark on an upper surface of the trace or on an upper surface of the optoelectronic device.

6. The optoelectronic module of claim 1 comprising a second wafer having a cutout region extending there through, at least part of the cutout region being located directly below an alignment mark on the optical element.

7. The optoelectronic module of claim 1 wherein the mask comprises a black chrome pattern on a transparent substrate.

8. The optoelectronic module of claim 1 further including a flex cable, wherein a portion of the second spacer is undercut to receive the flex cable, which is connected electrically to the electrically conductive trace.

9. The optoelectronic module of claim 8 further including a substrate on which the electrically conductive trace is mounted, wherein the electrically conductive trace defines channels that separate different parts of the trace electrically from one another, the channels containing adhesive that fixes the second spacer to the substrate.

10. The optoelectronic module of claim 9 wherein portions of the channels defined by the electrically conductive trace extend under the flex cable, and wherein the portions of the channels extending under the flex cable are not filled with adhesive.

11. A method of manufacturing an optoelectronic module, the method comprising:
   providing an assembly comprising:
      an optical element having a mask;
      an optical sub-assembly disposed over the optical element;
      a first spacer in direct contact with an upper surface of the optical element, the first spacer establishing a distance between the optical element and the optical sub-assembly;
      a second spacer that supports the optical element, wherein the first and second spacers are attached to one another by adhesive, and the optical element is disposed within a recess in the second spacer and is supported by direct contact with surfaces of the second spacer;
   performing optical testing of the assembly; and
   attaching the assembly to a sub-assembly that comprises an optoelectronic device mounted on an electrically conductive trace, wherein the optoelectronic device is operable to emit or detect light, and the electrically conductive trace is on an electrically insulating substrate, wherein attaching the assembly to the sub-assembly includes:
      bringing alignment surfaces of the second spacer into direct contact with an upper surface of the electrically conductive trace; and
      attaching the second spacer to the substrate by adhesive.

12. The method of claim 11 wherein bringing alignment surfaces of the second spacer into direct contact with the upper surface of the electrically conductive trace establishes a distance between the electrically conductive trace and the optical element.

13. The method of claim 11 wherein providing the assembly includes:
   bringing the alignment surfaces of the first spacer into direct contact with the upper surface of the optical element; and
   attaching the first spacer to the second spacer using adhesive.

14. The method of claim 11 wherein the optical testing of the assembly is performed prior to attaching the assembly to a sub-assembly.

15. The method of claim 14 wherein performing optical testing of the assembly includes emitting light through the optical element and the optical sub-assembly and evaluating optical performance of the assembly.

16. The method of claim 11 wherein the second spacer has flat surfaces at corners of the recess in which the optical element is disposed, and wherein providing the assembly includes:
   placing the optical element that includes the mask onto the flat surfaces such that an underside of the optical element is in direct contact with the flat surfaces to support the optical element.

17. The method of claim 16 wherein the second spacer has recessed pockets adjacent the flat surfaces, the method further including:
   providing adhesive in the recessed pockets prior to placing the optical element onto the flat surfaces; and
   subsequently fixing the optical element in place within the recess of the second spacer via the adhesive.

* * * * *